United States Patent
Smeys et al.

(10) Patent No.: US 8,443,511 B2
(45) Date of Patent: May 21, 2013

(54) METHOD OF FORMING A MEMS POWER INDUCTOR

(75) Inventors: Peter Smeys, Mountain View, CA (US); Peter Johnson, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 13/240,728

(22) Filed: Sep. 22, 2011

(65) Prior Publication Data
US 2012/0009689 A1   Jan. 12, 2012

Related U.S. Application Data

(62) Division of application No. 12/082,209, filed on Apr. 9, 2008, now Pat. No. 8,044,755.

(51) Int. Cl.
*H01F 7/06* (2006.01)

(52) U.S. Cl.
USPC .......... 29/606; 29/602.1; 29/607; 29/829; 29/832; 205/119; 205/122; 216/62; 216/65; 216/66; 336/178; 336/200; 336/212; 336/223; 336/232

(58) Field of Classification Search
USPC ......... 29/602.1, 606, 607, 829, 832; 205/119, 205/122; 216/62, 65, 66; 336/178, 200, 212, 336/223, 232
See application file for complete search history.

(56) References Cited

U.S. PATENT DOCUMENTS

| | | | |
|---|---|---|---|
| 6,128,160 A * | 10/2000 | Yamamoto | 360/324.11 |
| 7,518,481 B2 * | 4/2009 | Gardner et al. | 336/200 |
| 7,705,411 B2 | 4/2010 | Smeys et al. | |
| 8,048,704 B2 | 11/2011 | Smeys et al. | |
| 8,108,984 B2 * | 2/2012 | Gardner et al. | 29/602.1 |

* cited by examiner

Primary Examiner — Paul D Kim
(74) Attorney, Agent, or Firm — Eugene C. Conser; Wade J. Brady, III; Frederick J. Telecky, Jr.

(57) ABSTRACT

A scalable MEMS inductor is formed on the top surface of a semiconductor die. The MEMS inductor includes a plurality of magnetic lower laminations, a circular trace that lies over and spaced apart from the magnetic lower laminations, and a plurality of upper laminations that lie over and spaced apart from the circular trace.

19 Claims, 14 Drawing Sheets

METHOD OF FORMING A MEMS POWER INDUCTOR

This is a divisional application of U.S. application Ser. No. 12/082,209 filed on Apr. 9, 2008 now U.S. Pat. 8,044,755, by Peter Smeys et al.

BACKGROUND OF THE INVENTION

1. Field of the Invention

The present invention relates to a power inductor and, more particularly, to a MEMS power inductor and a method of forming the MEMS power inductor.

2. Description of the Related Art

A micro-electromechanical system (MEMS) inductor is a semiconductor structure that is fabricated using the same types of steps (e.g., the deposition of layers of material and the selective removal of the layers of material) that are used to fabricate conventional analog and digital CMOS circuits.

MEMS inductors can be formed as single or multiple loop coil structures. When greater inductance is required, the coil structure is typically formed around a magnetic core structure. Core structures formed from laminated Ni—Fe have been shown to have low eddy current losses, high magnetic permeability, and high saturation flux density.

MEMS inductors have been formed as stand-alone devices, and as on-chip devices where a MEMS inductor is formed on the top surface of a semiconductor chip that includes a circuit, such as a switching regulator, that is connected to the MEMS inductor. Fabricating a MEMS inductor on a semiconductor chip that includes a circuit which is connected to the inductor eliminates the electrical losses that would otherwise be associated with connecting an external stand-alone inductor to the circuit with bond wire connections.

Further, fabricating a MEMS inductor on a semiconductor chip that includes the circuit eliminates the circuit board area that would otherwise be required to accommodate an external stand-alone inductor, and also eliminates the assembly steps that would otherwise be required to place the external stand-alone inductor onto a circuit board.

FIG. 1 shows a cross-sectional view that illustrates an example of a prior-art semiconductor wafer 100 that includes analog circuits and MEMS inductors. As shown in FIG. 1, semiconductor wafer 100 includes a number of identical die-sized substrate regions 110, and a corresponding number of identical metal interconnect structures 112 that are connected to the substrate regions 110.

Each substrate region 110 includes a number of structures, such as resistors, transistors, capacitors, diodes, and similar devices, which are formed in and on the substrate region 110. Each metal interconnect structure 112, in turn, is a multi-layered structure that electrically interconnects together the various devices that are formed in a substrate region 110 to realize an electrical circuit.

As further shown in FIG. 1, the top section of each metal interconnect structure 112 includes a number of conductive structures 114, such as aluminum traces, and a layer of passivation material 116, such as silicon nitride, silicon oxide, or a combination of the two, that touches and isolates the conductive structures 114.

In addition, a number of openings are formed in the layer of passivation material 116 to expose selected regions SR1 on the top surfaces of the conductive structures 114 in each metal interconnect structure 112. The selected regions SR1, in turn, form connection points for a copper-topped structure. (Only one selected region SR1 is shown for clarity.)

Further, openings are also formed in the layer of passivation material 116 to expose selected regions SR2 and SR3 on the top surfaces of the conductive structures 114 in each metal interconnect structure 112. The selected regions SR2 and SR3 form first and second connection points for a MEMS inductor.

Semiconductor wafer 100 also includes a number of identical copper-topped structures 118 and a number of identical copper MEMS inductors 120 that are formed on the metal interconnect structures 112. Each copper-topped structure 118, which includes vias, traces, and pads, touches the passivation layer 116 and the selected regions SR1 of a metal interconnect structure 112. In operation, each copper-topped structure 118 provides signal and power routing, and external electrical connection points for an integrated circuit. Thus, once packaged, bonding wires can be connected to the pad regions of each copper-topped structure 118.

Each copper MEMS inductor 120, in turn, includes a base conductive plate 122 with a via extension 122A that touches the passivation layer 116 and the selected region SR2 of a metal interconnect structure 112, and a conductive plug 124 with a via extension 124A that touches the passivation layer 116 and the selected region SR3 of a metal interconnect structure 112.

Each MEMS inductor 120 further includes a top conductive plate 126 that lies over the base conductive plate 122. In the present example, the widths and thicknesses of the plates 122 and 126 are substantially identical. Each top conductive plate 126 has a first via extension 126A that touches a base conductive plate 122 of a metal interconnect structure 112, and a second via extension 126B that touches a conductive plug 124 of a metal interconnect structure 112. In addition, base conductive plate 122, top conductive plate 126, and the via extensions 126A and 126B, define an enclosed region 130 that lies only between the base and top conductive plates 122 and 126, and the via extensions 126A and 126B.

In the FIG. 1 example, each MEMS inductor 120 also includes a magnetic core structure 132 that is located within enclosed region 130, and within no other enclosed regions. Magnetic core structure 132, which is electrically isolated from all other conductive regions, can be implemented in a number of prior-art fashions. For example, magnetic core structure 132 can be implemented with a number of laminated permalloy (Ni—Fe) cores 134 as described in U.S. Pat. No. 7,250,842, issued on Jul. 31, 2007 to Peter Johnson, et al., which is hereby incorporated by reference. The thickness of the laminations must be thin enough to minimize eddy currents.

As further shown in FIG. 1, semiconductor wafer 100 additionally includes an isolation film 136 that touches passivation layer 116, the copper-topped structures 118, and the copper MEMS inductors 120. Isolation film 136 can be implemented with, for example, an oxide or benzocyclobutene (BCB).

In operation, a current I1 can flow into a MEMS inductor 120 through base conductive plate 122 by way of via extension 122A and selected region SR2, and flow out of conductive plug 124 via selected region SR3. A current I2 can also flow in the opposite direction, flowing into MEMS inductor 120 through conductive plug 124 by way of selected region SR3, and out along via extension 122A of base conductive plate 122 and selected region SR2. A current flowing through an inductor generates a magnetic field which produces a magnetic flux density. The magnetic flux density, in turn, is a measure of the total magnetic effect that is produced by the current flowing through the inductor.

One problem with the formation of a MEMS inductor is that it is difficult to form a MEMS inductor that is scalable to frequencies of operation that are greater than 10 MHz at high currents that are greater than a few 100 mA. Thus, there is a need for a scalable MEMS inductor and a method of forming the MEMS inductor.

BRIEF DESCRIPTION OF THE DRAWINGS

FIG. 2A is a plan view. FIG. 2B is a cross-sectional view taken along line 2B-2B of FIG. 2A. FIG. 2C is a cross-sectional view taken along line 2C-2C of FIG. 2A.

FIGS. 3A-14A are plan views. FIGS. 3B-14B are cross-sectional views taken along line 3B-3B through line 14B-14B of FIGS. 3A-14A, respectively. FIGS. 3C-14C are cross-sectional views taken along line 3C-3C through line 14C-14C of FIGS. 3A-14A, respectively.

DETAILED DESCRIPTION OF THE INVENTION

Figure 1:
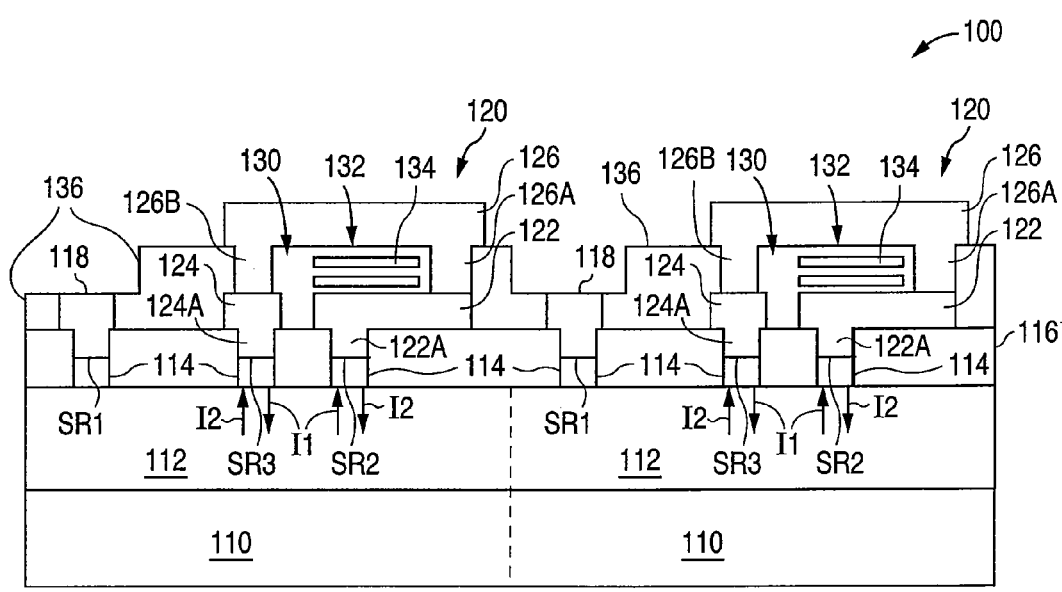
FIG. 1 is a cross-sectional view illustrating an example of a prior-art semiconductor wafer 100 that includes analog circuits and MEMS inductors.
Figure 2A:
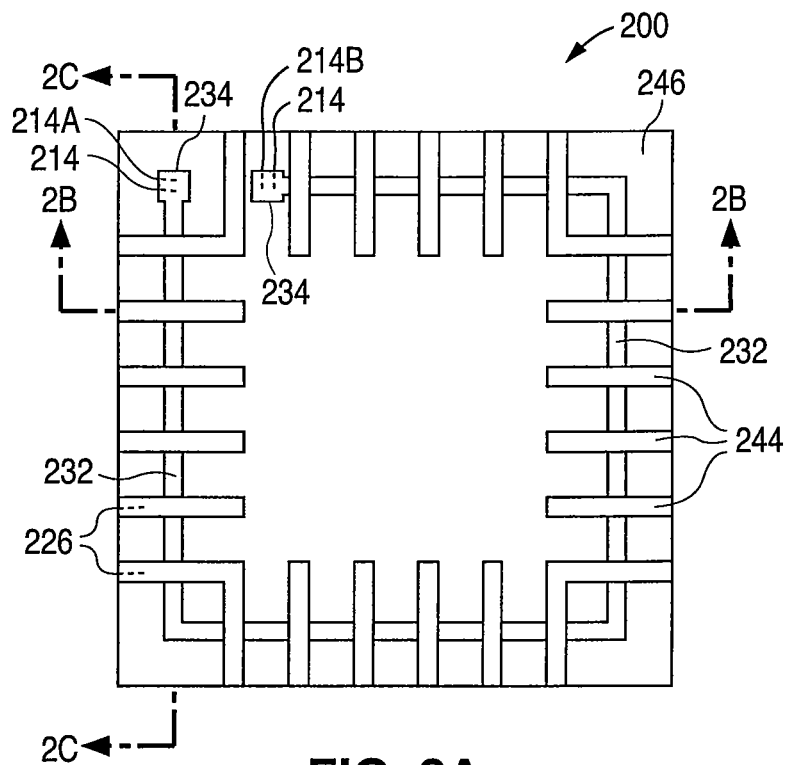
FIGS. 2A-2C are views illustrating an example of a semiconductor wafer 200 that includes analog circuits and MEMS inductors in accordance with the present invention.
Figure 2B:
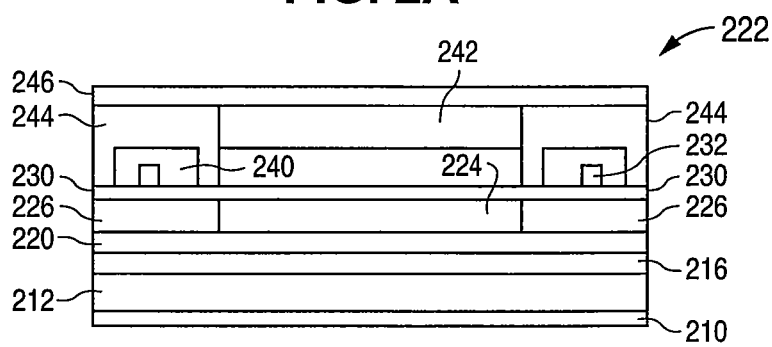
Figure 2C:
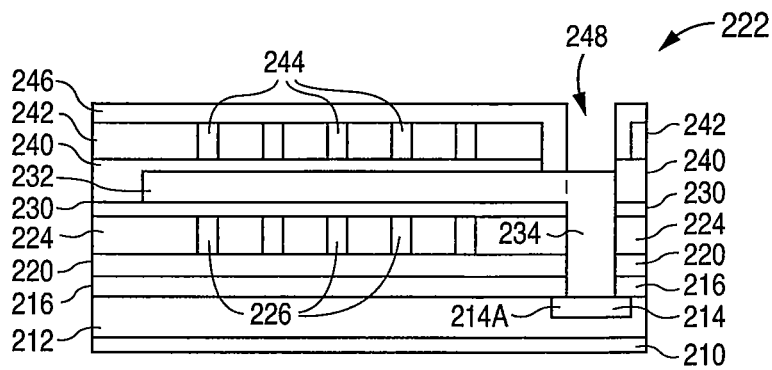

FIGS. 2A-2C show views that illustrate an example of a semiconductor wafer 200 that includes analog circuits and MEMS inductors in accordance with the present invention. FIG. 2A shows a plan view, while FIG. 2B shows a cross-sectional view taken along line 2B-2B of FIG. 2A, and FIG. 2C shows a cross-sectional view taken along line 2C-2C of FIG. 2A.

As described in greater detail below, the present invention forms a scalable MEMS inductor on the top surface of a semiconductor die. The MEMS inductor includes a number of magnetic lower laminations, a circular trace that lies directly over the magnetic lower laminations, and a number of upper laminations that directly lie over the circular trace.

As shown in FIGS. 2A-2C, semiconductor wafer 200 includes a number of identical die-sized substrate regions 210, and a corresponding number of identical metal interconnect structures 212 that are connected to the substrate regions 210. (Only one die-sized region 210 and one metal interconnect structure 212 are shown for simplicity.)

Each substrate region 210 includes a number of structures, such as resistors, transistors, capacitors, diodes, and similar devices, which are formed in and on the substrate region 210. Each metal interconnect structure 212, in turn, is a multi-layered structure that electrically interconnects together the various devices that are formed in a substrate region 210 to realize an electrical circuit.

In addition, the top section of each metal interconnect structure 212 includes a number of conductive structures 214, such as aluminum traces, and a layer of passivation material 216, such as silicon nitride, silicon oxide, or a combination of the two, that touches and isolates the conductive structures 214. The conductive structures 214, in turn, include a pair of MEMS-supporting conductive structures 214A and 214B. For example, the pair of MEMS-supporting conductive structures 214A and 214B can represent the input and the output nodes of a MEMS inductor.

Further, in the present example, semiconductor wafer 200 includes a stress relief layer 220 that lies on passivation layer 216. Stress relief layer 220 is able to laterally deform enough to absorb dimensional changes from the materials used to form a MEMS inductor, and prevent stress from being transmitted to the underlying metal interconnect structures 212 and substrate regions 210.

Stress relief layer 220 is implemented with a material that has a maximum bulk elongation that is substantially greater than the maximum bulk elongation of the material used to form passivation layer 216, such as silicon oxide and silicon nitride, and the maximum bulk elongation of the materials used to form the MEMS devices, such as oxide, SU-8 epoxy, permalloy, and copper. Bulk elongation is a well-known measure of the amount a structure can stretch before it breaks.

For example, stress relief layer 220 can be implemented with a spin-on benzocyclobutene (BCB) or photoimagible elastomer, such as photoimagible silicone WL-5150 manufactured by Dow Corning®. The adhesion properties of these two materials are excellent, and provide a suitable base layer for subsequent MEMS processing.

BCB has a maximum bulk elongation of approximately 8%, while the Dow Corning material has a maximum bulk elongation of approximately 30%. Alternately, other formulations of isolating films with large maximum bulk elongation values would work equally well. By contrast, silicon oxide and silicon nitride have a very small maximum bulk elongation of, for example, 2%. Similarly, copper, permalloy, silicon dioxide, and SU-8 epoxy have a very small maximum bulk elongation of, for example, 2%. Thus, the maximum bulk elongation of stress relief layer 220 is substantially greater than the maximum bulk elongations of passivation layer 216 and the materials that are used to form a MEMS device, ranging from approximately 4× to 15× greater.

In addition, stress relief layer 220 can also be implemented with a material that can be fully cured (hardened) at a temperature, such as 250° C., that is greater than the highest subsequent processing temperature. The advantage of curing stress relief layer 220 at a temperature that is higher than the highest subsequent process temperature ensures stability of the film.

In accordance with the present invention, as shown in FIGS. 2A-2C, semiconductor wafer 200 also includes a MEMS inductor 222 that lies on stress relief layer 220 and is electrically connected to the pair of MEMS-supporting conductive structures 214A and 214B. MEMS inductor 222 includes a non-conducting lower mold 224 that touches stress relief layer 220, and a number of magnetic lower laminations 226 that are formed in mold 224 over each metal interconnect structure 212.

In the present example, mold 224 is implemented with SU-8 which, as noted above, has a very low maximum bulk elongation when compared to the maximum bulk elongation of stress relief layer 220. In addition, the magnetic lower laminations, which function as a lower magnetic core structure, can be implemented with, for example, laminated permalloy (NiFe) or other magnetic materials. The thickness of the laminations must be thin enough to minimize eddy currents. Further, the magnetic lower laminations 226 are totally electrically isolated from each other and all other conductive structures.

In addition, MEMS inductor 222 includes a magnetic gap dielectric layer 230 that is formed on mold 224 and the magnetic lower laminations 226 over each metal interconnect structure 212. The magnetic gap dielectric layer 230 can be implemented with, for example, SU-8 epoxy. Mold 224 and magnetic gap dielectric layer 230 electrically isolate each of the magnetic lower laminations 226.

MEMS inductor 222 further includes a (square) circular copper trace 232 that touches magnetic gap dielectric layer 230, and a pair of copper plugs 234 that touch the pair of MEMS-supporting conductive structures 214A and 214B. Copper trace 232, which lies directly over each of the magnetic lower laminations 226, is illustrated in FIGS. 2A-2B with a single loop, although copper trace 232 can alternately be formed to have multiple loops.

As further shown in FIGS. 2A-2C, MEMS inductor 222 includes a non-conducting base mold 240 that is formed on magnetic gap dielectric layer 230 and circular copper trace 232, and a non-conducting cap mold 242 that is formed on base mold 240. The base and cap molds 240 and 242, which form a single upper mold, can be implemented with, for example, SU-8 epoxy.

In addition, MEMS inductor 222 includes a number of magnetic upper laminations 244 that touch molds 240 and 242 (the upper mold) directly over each metal interconnect structure 212. In addition, the magnetic upper laminations, which function as an upper magnetic core structure, can be implemented with, for example, laminated permalloy (NiFe) or other magnetic materials. The thickness of the laminations must be thin enough to minimize eddy currents. Further, the magnetic upper laminations 244 are totally electrically isolated from each other and all other conductive structures.

As shown in FIGS. 2A-2C, each magnetic upper lamination 244, which lies directly over copper trace 232, has vias that extend down so that each magnetic upper lamination 244 lies along three cross-sectional sides of circular copper trace 232, while a corresponding magnetic lower lamination 226 extends along the fourth cross-sectional side of circular copper trace 232.

MEMS inductor 222 also includes a passivation layer 246 that is formed on mold 242 and the magnetic upper laminations 244. Molds 240 and 242 (the upper mold) and passivation layer 246 electrically isolate each of the magnetic upper laminations 244. Passivation layer 246 can be implemented with, for example, benzocyclobutene (BCB). In addition, openings 248 are formed in passivation layer 246 to expose the copper plugs 234.

Thus, in the present example, wafer bow is prevented by utilizing a stress relief layer 220 that laterally deforms enough to absorb dimensional changes from the materials that are used to form the MEMS inductors, and thereby prevents stress from being transmitted to the underlying metal interconnect structures 212 and substrate regions 210.

FIGS. 3A-3C through FIGS. 14A-14C show views that illustrate an example of a method of forming an integrated circuit with a MEMS inductor in accordance with the present invention. FIGS. 3A-14A show plan views, while FIGS. 3B-14B show cross-sectional views taken along line 3B-3B through line 14B-14B of FIGS. 3A-14A, respectively, and FIGS. 3C-14C show cross-sectional views taken along line 3C-3C through line 14C-14C of FIGS. 3A-14A, respectively.

Figure 3A:
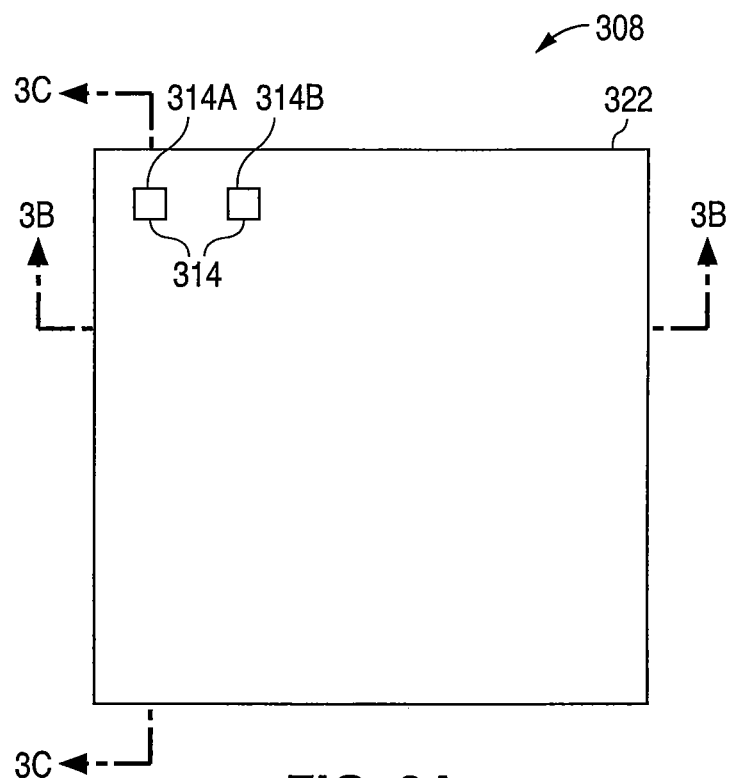
FIGS. 3A-3C through FIGS. 14A-14C are views illustrating an example of a method of forming an integrated circuit with a MEMS inductor in accordance with the present invention.
Figure 3B:
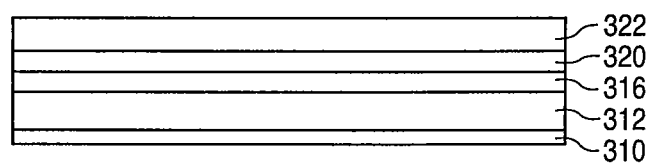
Figure 3C:
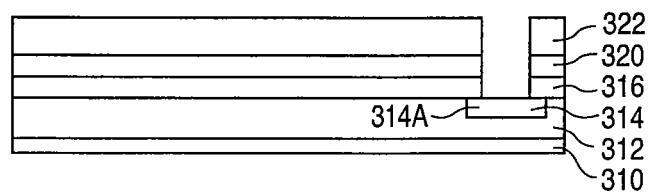

As shown in FIGS. 3A-3C, the method utilizes a conventionally-formed semiconductor wafer 308 that includes a number of identical die-sized substrate regions 310, and a corresponding number of identical metal interconnect structures 312 that are connected to the substrate regions 310. (Only one die-sized region 310 and one metal interconnect structure 312 are shown for simplicity.)

Each substrate region 310 includes a number of structures, such as resistors, transistors, capacitors, diodes, and similar devices, which are formed in and on the substrate region 310. Each metal interconnect structure 312, in turn, is a multi-layered structure that electrically interconnects together the various devices that are formed in a substrate region 310 to realize an electrical circuit.

As further shown in FIGS. 3A-3C, the top section of each metal interconnect structure 312 includes a number of conductive structures 314, such as aluminum traces and bond pads, and a layer of passivation material 316, such as silicon nitride, silicon oxide, or a combination of the two, that touches and isolates the conductive structures 314.

The method begins by forming a stress relief layer 320 on the top surface of passivation layer 316. In the present example, stress relief layer 320 is implemented with a material that has a maximum bulk elongation that is substantially greater than the maximum bulk elongation of the material used to form passivation layer 316.

For example, a 5 µm thick film of BCB or WL-5150 on top of passivation layer 316 can effectively absorb the lateral stress from a MEMS structure (e.g., SU-8/copper/permalloy) which has a thickness of 5-100 µm. In addition, stress relief layer 320 can be implemented with a material that can be cured at a temperature that is higher than the highest subsequent process temperature.

Referring back to FIGS. 3A-3C, once stress relief layer 320 has been formed, a mask 322 is formed and patterned on stress relief layer 320. Following this, the exposed regions of stress relief layer 320 are etched to expose a pair of conductive structures 314A and 314B in each metal interconnect structure 312 that correspond with the input and output of an inductor. (Other conductive structures 314 can also be exposed at this time if the external connections for the die are to be on the top of wafer 308.) Mask 322 is then removed.

Figure 4A:
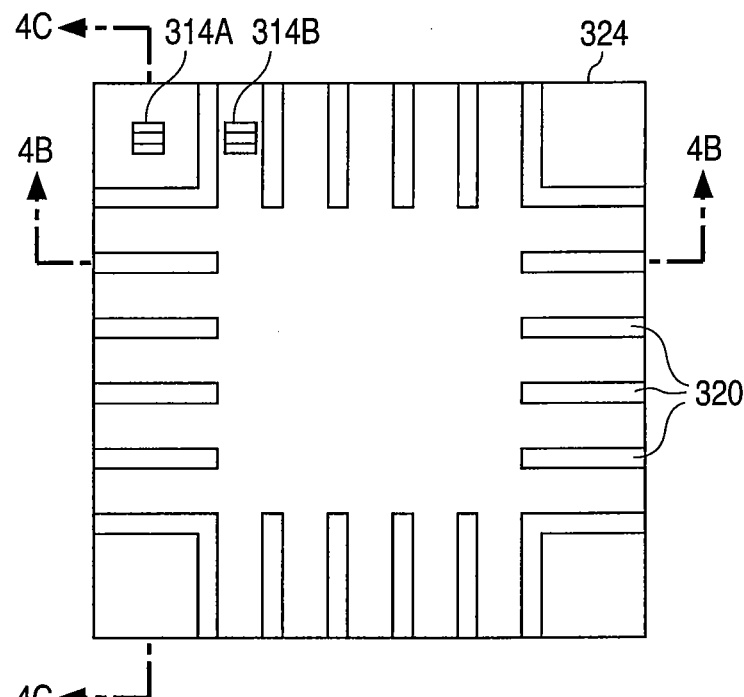
Figure 4B:
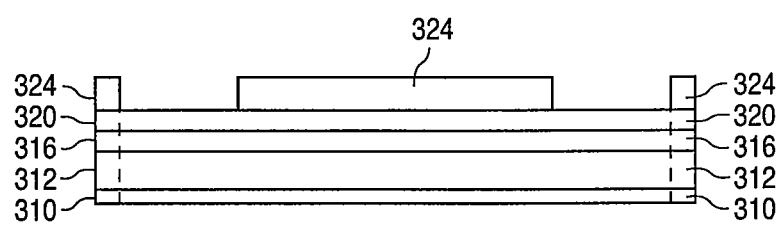
Figure 4C:
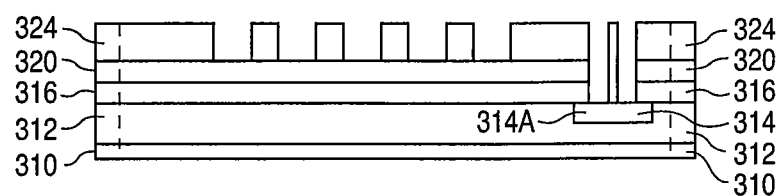

After mask 322 has been removed, as shown in FIGS. 4A-4C, a non-conductive mold 324 is formed on stress relief layer 320. Mold 324 can be formed, for example, by coating the exposed surfaces with 40 µm of SU-8 epoxy, followed by a soft bake at 95° C. for 10-15 minutes. After this, the soft baked epoxy is selectively exposed to ultraviolet light (365 nm) by a mask aligner to transfer a geometric pattern into the soft baked epoxy.

Following this, the soft baked epoxy is again baked, and then developed, such as by using immersion development at room temperature. After the development, the unexposed regions of the soft baked epoxy are rinsed away and removed. Once the unexposed regions of the soft baked epoxy have been removed, the developed expoxy is cured to form mold 324. As shown in FIGS. 4A and 4C, mold 324 includes multiple openings that expose the top surface of each conductive structure 314. The multiple openings are sized such that the openings pinch off during a subsequent copper plating process to form a more planar top surface.

Figure 5A:
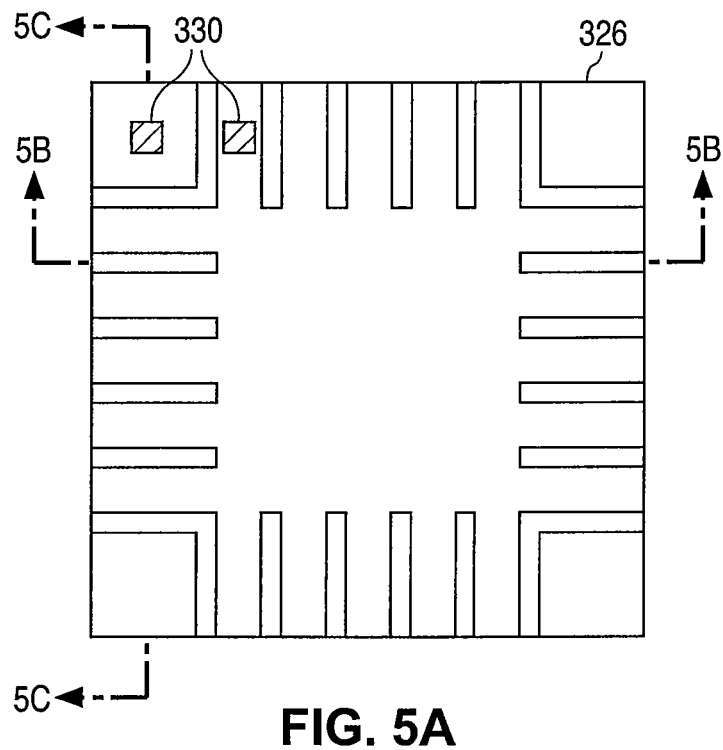
Figure 5B:
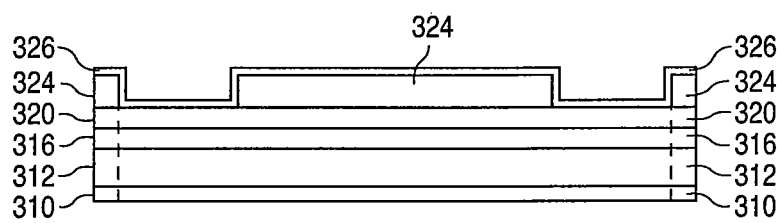
Figure 5C:
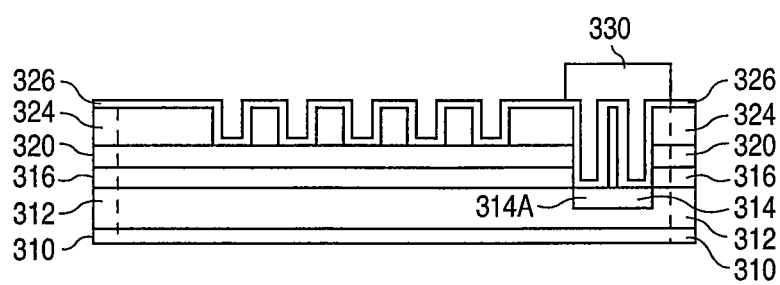

As shown in FIGS. 5A-5C, after mold 324 has been formed, a copper seed layer 326 is formed on mold 324 and the top surfaces of the conductive structures 314. Copper seed layer 326 can be implemented with, for example, 300 Å of titanium, 3000 Å of copper, and 300 Å of titanium. The lower titanium layer enhances the adhesion between the aluminum and copper. Following this, a mask 330 is formed and patterned on copper seed layer 326. As shown in FIGS. 5A-5C, mask 330, which can be implemented with, for example, NR2 manufactured by Futurrex, covers and protects the top surfaces of the conductive structures 314.

Figure 6A:
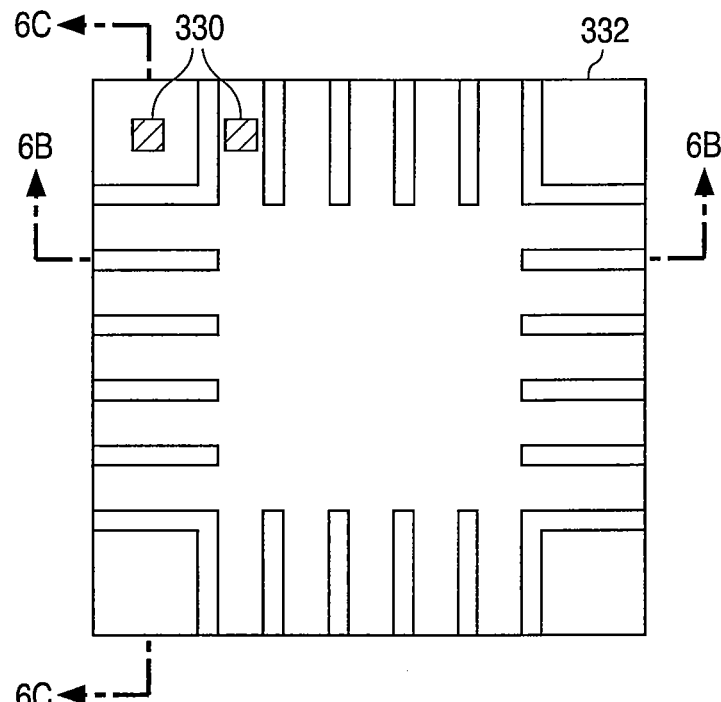
Figure 6B:
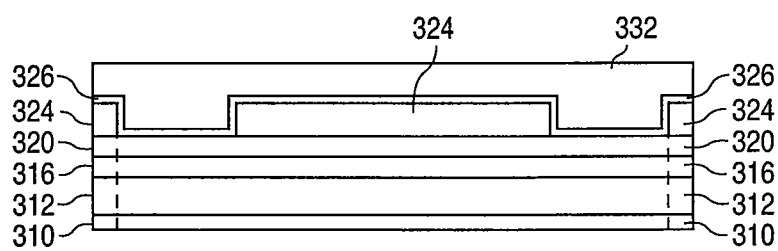
Figure 6C:
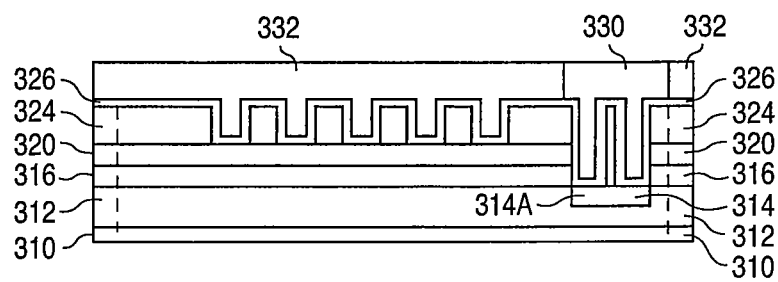
Figure 7A:
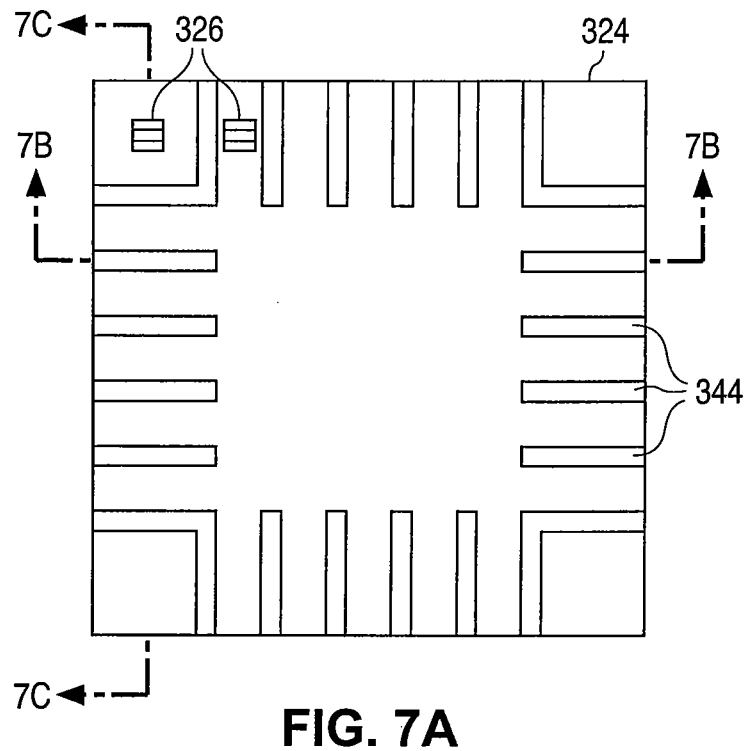
Figure 7B:
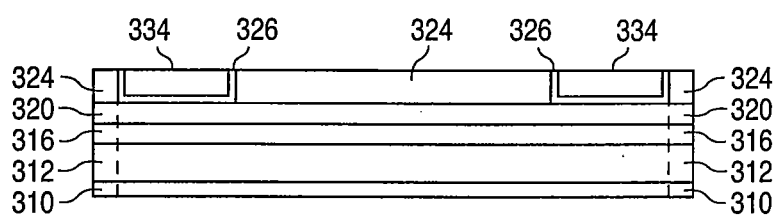
Figure 7C:
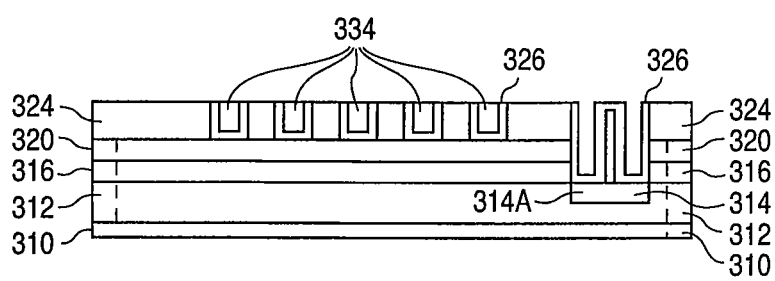

Following the formation of mask 330, as shown in FIGS. 6A-6C, the top titanium layer of seed layer 326 is removed. Permalloy (NiFe) is next deposited and electroplated (with a 50% overburden to insure that the widest opening is completely filled) to form a magnetic region 332. (Other magnetic materials can alternately be used.) After this, as shown in FIGS. 7A-7C, magnetic region 332 is planarized until magnetic region 332 has been removed from the top surface of mold 324. The planarization forms a number of magnetic lower laminations 334 over each metal interconnect structure 312. Following the planarization, the remains of mask 330 are removed.

Figure 8A:
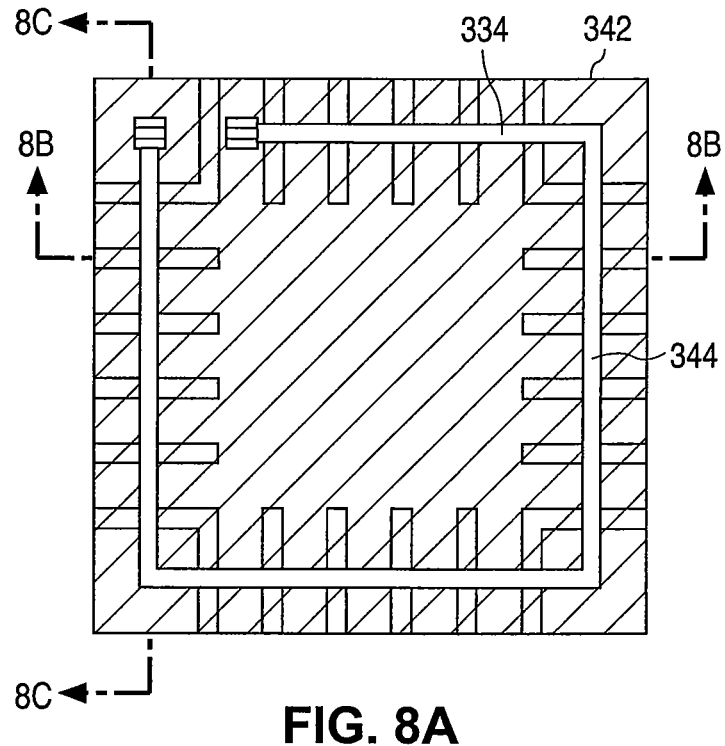
Figure 8B:
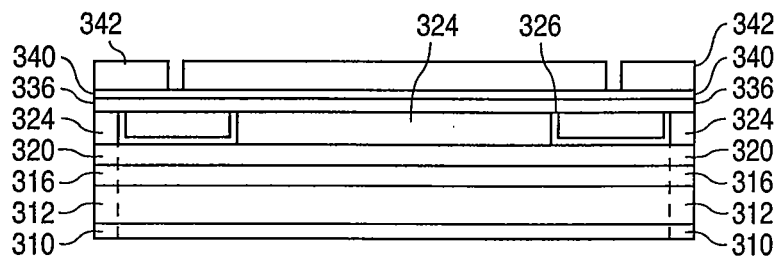
Figure 8C:
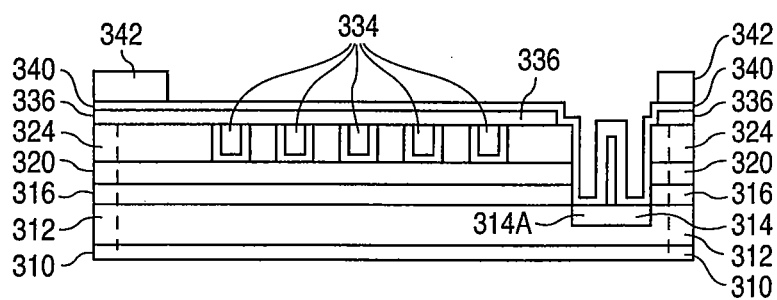

Next, as shown in FIGS. 8A-8C, a magnetic gap dielectric layer 336 approximately 1 μm thick is formed on mold 324 and the magnetic lower laminations 334 over each metal interconnect structure 312. The magnetic gap dielectric layer 336 can be formed using, for example, SU-8 epoxy spun on to a thickness of approximately 1-3 μm. When using SU-8, dielectric layer 336 is formed in the same manner as mold 324, except that the various times (e.g., soft bake, exposure, and development times) are a function of the thickness of the material.

After magnetic gap dielectric layer 336 has been formed, a copper seed layer 340 is formed on magnetic gap dielectric layer 336 and copper seed layer 326. Copper seed layer 340 can be implemented with, for example, 300 Å of titanium, 3000 Å of copper, and 300 Å of titanium. After copper seed layer 340 has been formed, a non-conductive mold 342 is formed on copper seed layer 340. Mold 342 can be formed, for example, by forming and patterning a photoresist layer, such as NR2, to have a thickness of approximately 55 μm.

Figure 9A:
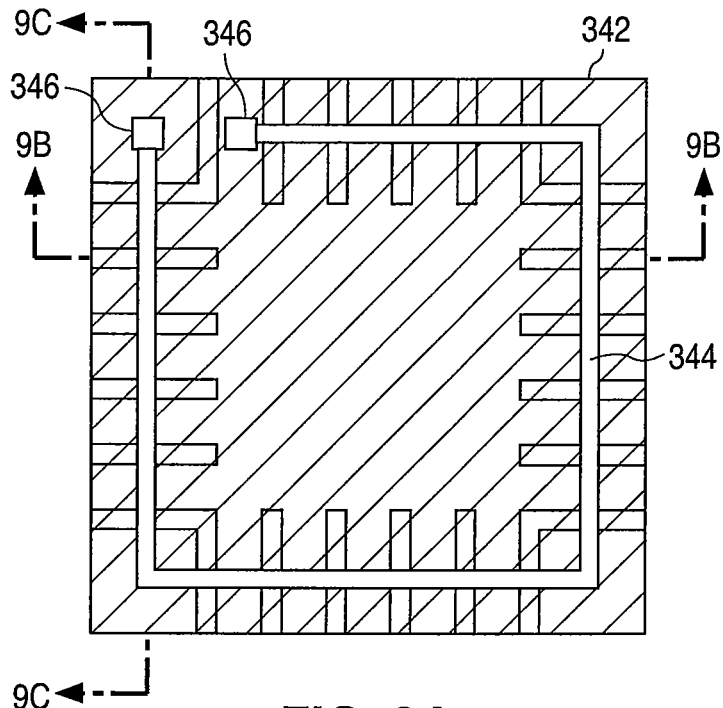
Figure 9B:
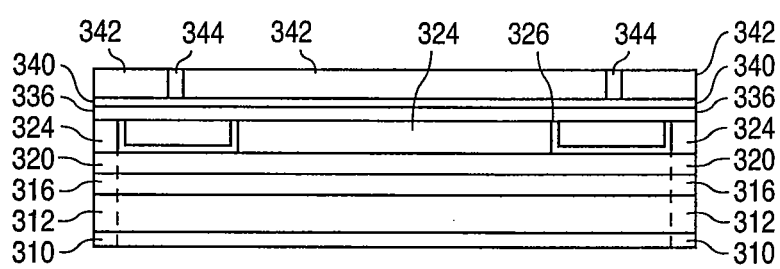
Figure 9C:
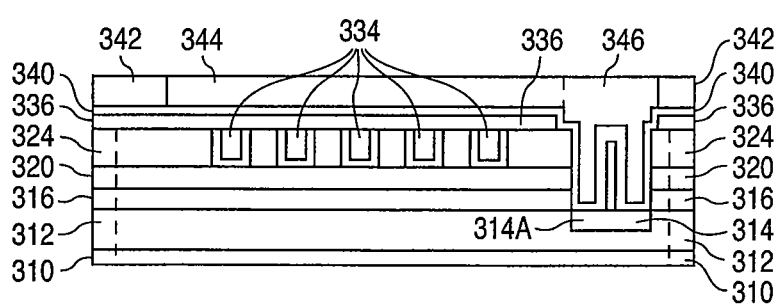

As shown in FIGS. 9A-9C, following the formation of mold 342, the top titanium layer of seed layer 340 is removed. Copper is next deposited and electroplated to form a circular copper trace 344 and a pair of copper plugs 346 approximately 50 μm thick. (Nickel and gold can also be formed on the copper plugs 346 for wire bonding if needed.) Copper trace 344 is illustrated with a single loop, although copper trace 344 can be formed to have multiple loops. After this, mold 342 is removed, followed by the removal of the exposed regions of copper seed layer 340.

Figure 10A:
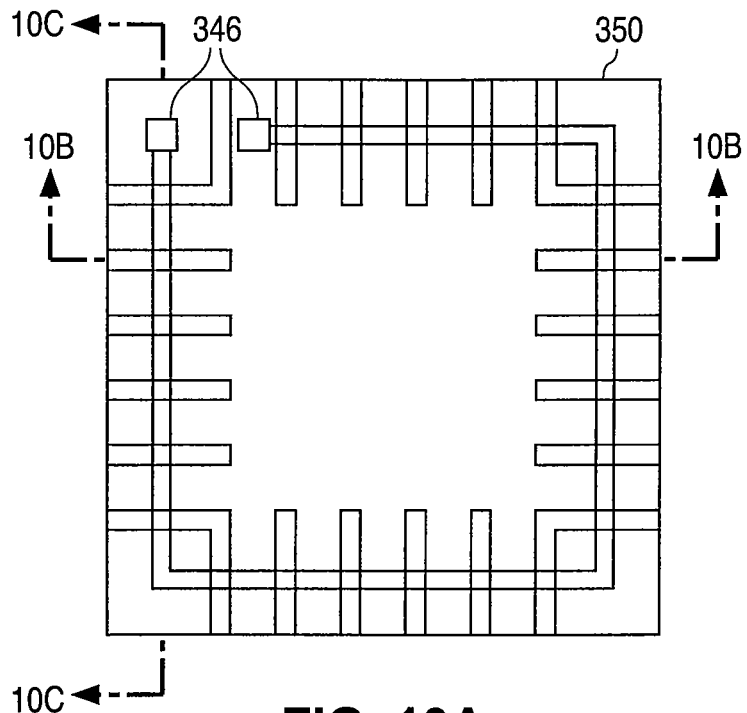
Figure 10B:
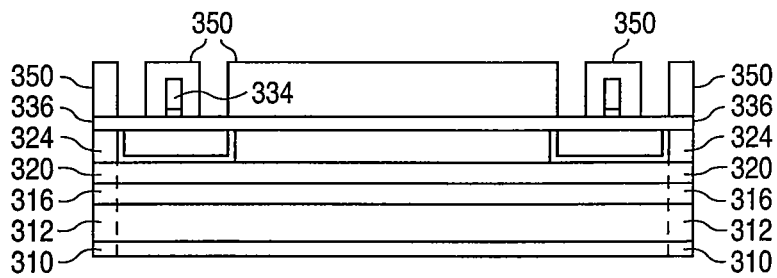
Figure 10C:
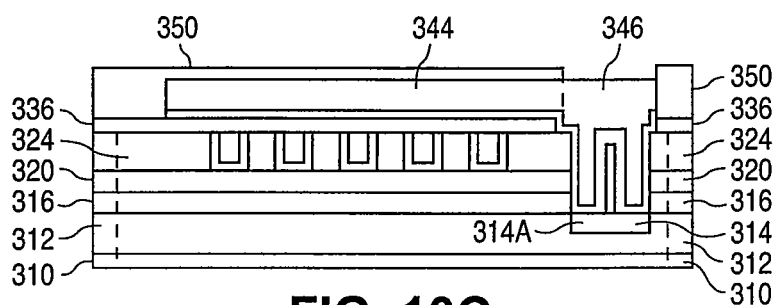

After mold 342 and the exposed regions of copper seed layer 340 have been removed, as shown in FIGS. 10A-10C, a non-conductive base mold 350 is formed on magnetic gap dielectric layer 336, circular copper trace 344, and the copper plugs 346. Base mold 350 can be formed to have a thickness of approximately 55 μm in the same manner as mold 324.

Figure 11A:
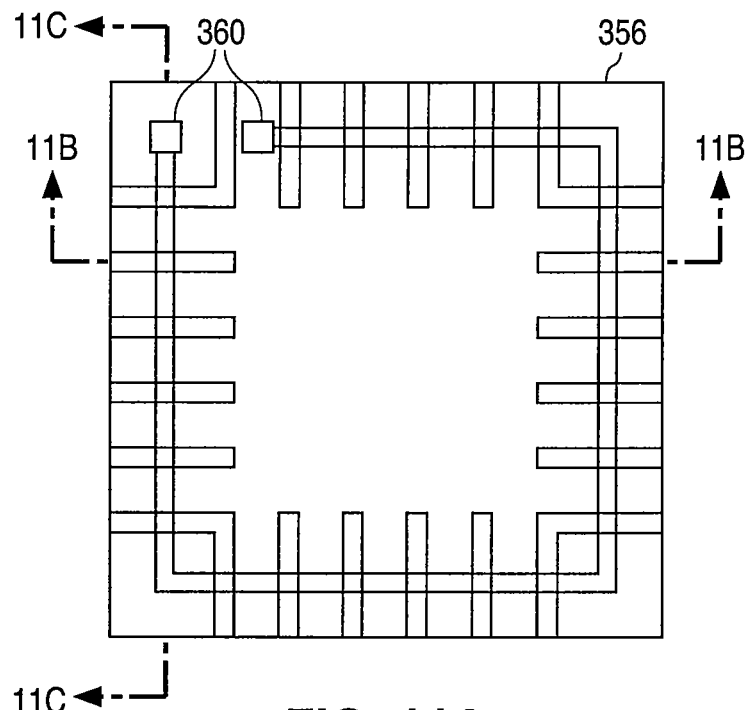
Figure 11B:
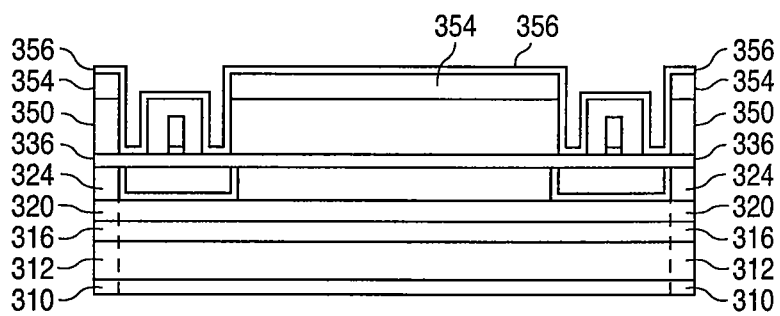
Figure 11C:
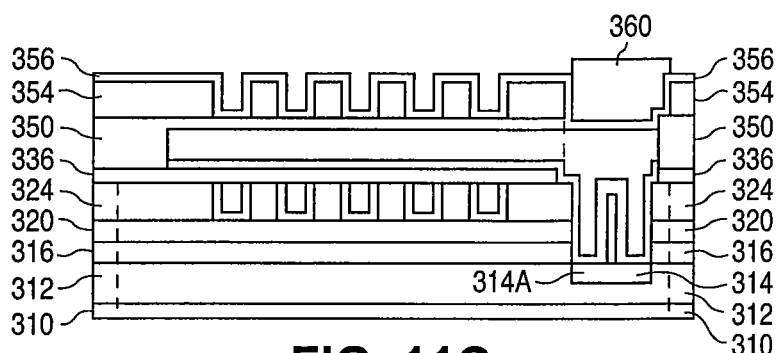

After base mold 350 has been formed, as shown in FIGS. 11A-11C, a non-conductive cap mold 354 is formed on mold 350. (Alternately, rather than forming base mold 350 and cap mold 352, a single upper mold can be formed by using a variable transmission mask.) Mold 354 can be formed to have a thickness of approximately 35 μm in the same manner as mold 350. After mold 354 has been formed, a copper seed layer 356 is formed on the copper plugs 346 and the exposed regions of molds 350 and 354. Copper seed layer 356 can be implemented with, for example, 300 Å of titanium, 3000 Å of copper, and 300 Å of titanium. Following this, a mask 360 is formed and patterned on copper seed layer 356. As shown in FIGS. 11A-11C, mask 360 covers and protects the copper seed layer 356 that lies over the copper plugs 346. (Mold 354 exposes the top surfaces of the copper plugs 346 of the inductor, but need not expose the top surfaces of the copper plugs 346 of the inductor if no wire bonding to the top surfaces of the copper plugs 346 is to occur.)

Figure 12A:
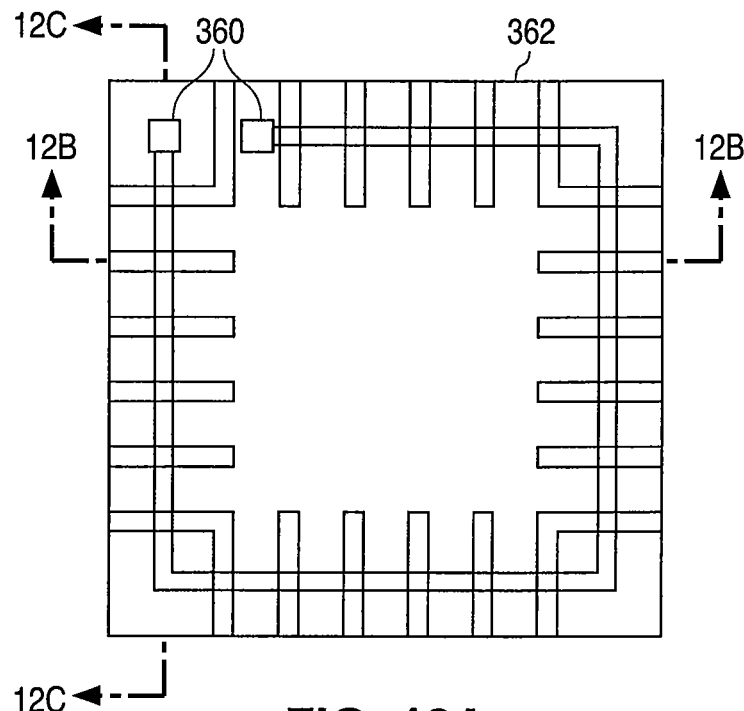
Figure 12B:
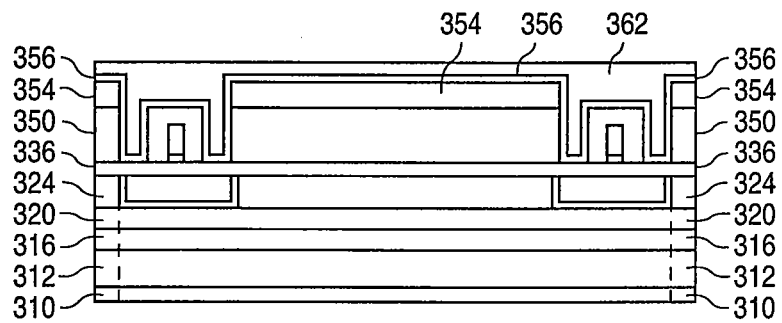
Figure 12C:
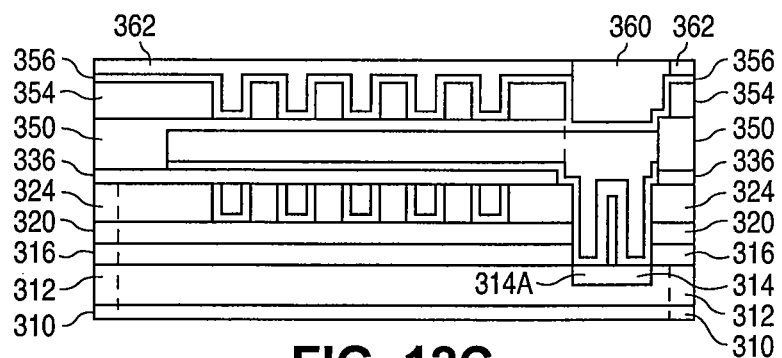

As shown in FIGS. 12A-12C, following the formation of mask 360, the top titanium layer of seed layer 356 is removed. Permalloy (NiFe) is next deposited and electroplated (with a 50% overburden to insure that the widest opening is completely filled) to form a magnetic region 362 approximately 5 μm thick.

Figure 13A:
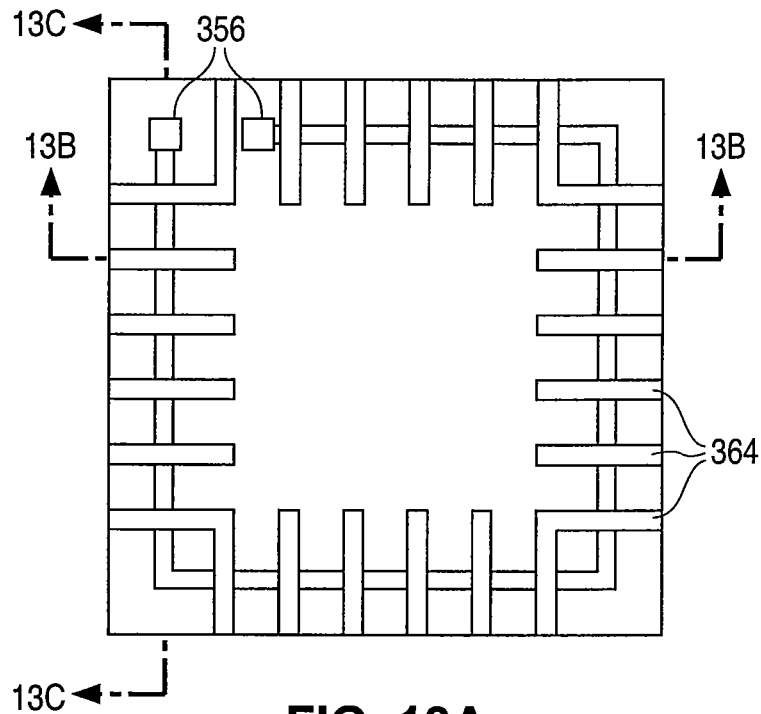
Figure 13B:
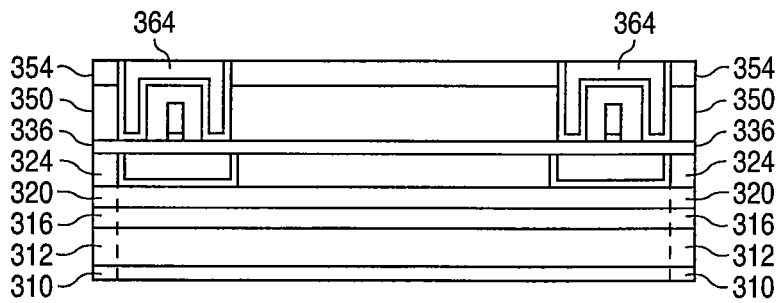
Figure 13C:
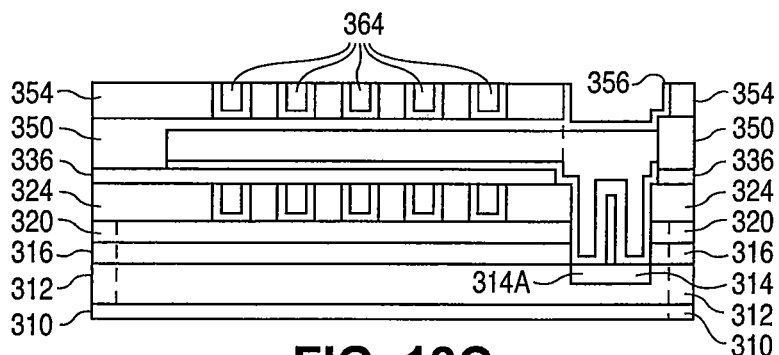

After this, as shown in FIGS. 13A-13C, magnetic region 362 is planarized until magnetic region 362 has been removed from the top surface of mold 354. The planarization forms a number of magnetic upper laminations 364 with via extensions over each metal interconnect structure 312. Following the planarization, the remains of mask 360 are removed.

Figure 14A:
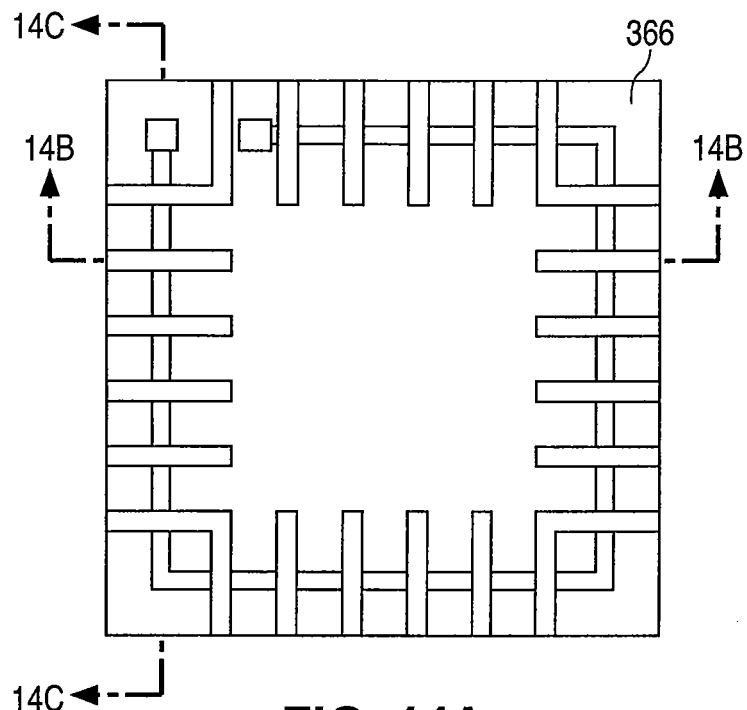
Figure 14B:
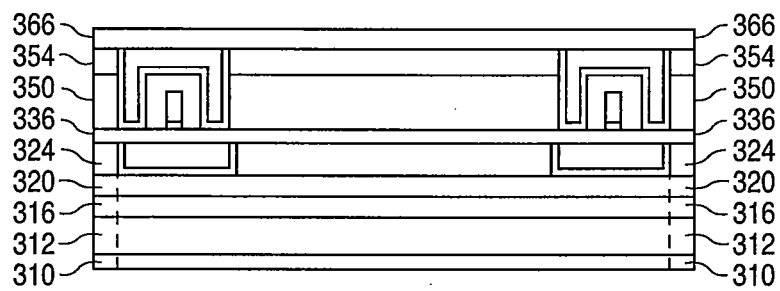
Figure 14C:
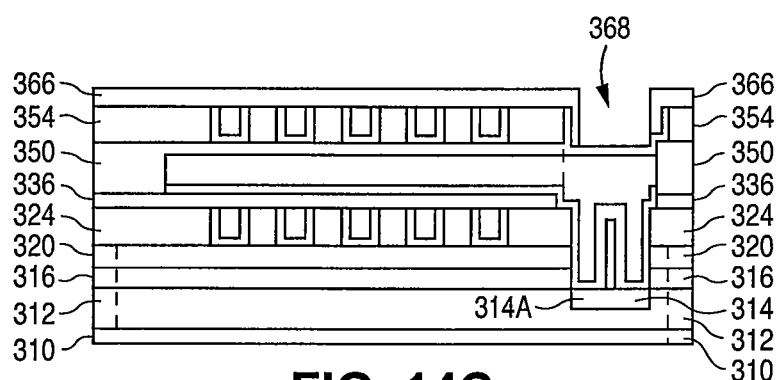

Next, as shown in FIGS. 14A-14C, a passivation layer 366 is formed on mold 354 and the magnetic upper laminations 364. Passivation layer 366 can be implemented with, for example, benzocyclobutene (BCB) or SU-8 epoxy. Following this, openings 368 are formed in passivation layer 366 to expose the copper seed layer 356 that lies over the copper plugs 346.

In a first alternate embodiment, the magnetic upper laminations 364 can be differently formed. As shown in FIGS. 13A-13C, each magnetic upper lamination 364 has a single horizontal member that touches a single pair of spaced-apart vertical via extensions (and no other conductive structures). In the first alternate embodiment, a number of spaced-apart horizontal members can be connected to a single pair of spaced-apart vertical via extensions. This embodiment allows wider via extensions to be formed.

In a second alternate embodiment, after base mold 350 has been formed in FIGS. 10A-10C, a copper seed layer can be formed, followed by the formation of a protective mask over the copper plugs 346. Following this, permalloy is deposited and electroplated. The top surface is then planarized to remove permalloy and the copper seed layer from the top surface of base mold 350 to form the via extensions. Cap mold 354 is then formed. This alternate allows the via extensions of the magnetic upper laminations 364 to be separately formed from the horizontal members.

Thus, an integrated circuit with a scalable MEMS inductor and a method of forming the inductor have been described. High inductance values and high maximum operational currents are achieved by making the core elements thick, and by using thick copper wiring to reduce the DC resistance.

It should be understood that the above descriptions are examples of the present invention, and that various alternatives of the invention described herein may be employed in practicing the invention. Therefore, it is intended that the following claims define the scope of the invention and that structures and methods within the scope of these claims and their equivalents be covered thereby.

What is claimed is:

1. A method of forming a semiconductor inductor comprising:
   providing a conventionally formed semiconductor wafer that includes a plurality of identical die-sized substrate regions, and a corresponding number of identical metal interconnect structures that are connected to the substrate regions;
   wherein the metal interconnect structures include a plurality of aluminum traces and bond pads;
   depositing a layer of passivation material that touches and isolates the interconnect structures;
   forming a stress relief layer on the top surface of the layer of passivation material;
   patterning and etching a pair of openings through the stress relief layer to expose the metal interconnect structure that corresponds with the input and output of an inductor, using standard photolithigraphic techniques;
   forming a lower mold, the lower mold being non-conductive and having a top surface and a plurality of openings;
   forming a plurality of lower magnetic members in the plurality of openings to touch the lower mold, the plurality of lower magnetic members being spaced apart from each other;

planarizing the plurality of lower magnetic members so that a top surface of each lower magnetic member and the top surface of the lower mold lie substantially in a single horizontal plane;

forming a non-conductive structure to touch the lower mold and the lower magnetic members; and forming a conductive trace to touch the non-conductive structure, and lie directly over and spaced apart from each of the lower magnetic members.

2. The method of claim 1 wherein the plurality of lower magnetic members lie around a periphery of a die.

3. The method of claim 1 wherein forming the plurality of lower magnetic members includes depositing a seed layer to touch the lower mold and the top surfaces of the interconnect structure and electroplating a magnetic material on the top surface of the the seed layer.

4. The method of claim 1 wherein the stress relief layer is able to laterally deform enough to absorb dimensional changes from the material used in the inductor, and prevents stress from being transmitted to the underlying metal interconnect structures and substrate regions.

5. The method of claim 1 and further comprising forming a nonconductive member to touch and lie over the conductive trace.

6. The method of claim 5 and further comprising forming a plurality of upper magnetic members to touch the non-conductive member, the plurality of upper magnetic members being spaced apart from each other and the plurality of lower magnetic members, and lying directly over the conductive trace and the plurality of lower magnetic members.

7. The method of claim 6 wherein forming the plurality of upper magnetic members includes:

forming an upper mold to touch the non-conductive region, the upper mold being non-conductive and having a top surface; and depositing a seed layer to touch the upper mold and electroplating a magnetic material on the top surface of the seed layer.

8. The method of claim 7 wherein forming the plurality of upper magnetic members further includes planarizing the magnetic material that touches the upper mold so that a top surface of each upper magnetic member and the top surface of the upper mold lie substantially in a single horizontal plane.

9. The method of claim 6 wherein each upper magnetic member lies horizontally adjacent to and spaced apart from the conductive trace.

10. The method of claim 6 wherein the lower magnetic members include permalloy.

11. The method of claim 6 wherein the conductive trace is spaced apart from the upper magnetic members.

12. A method of forming a semiconductor inductor comprising:

forming a stress relief layer on the top surface of a conventially formed semiconductor wafer;

patterning and etching a pair of openings through the stress relief layer to expose the metal interconnect structure that corresponds with the input and output of an inductor, using standard photolithigraphic techniques;

forming a plurality of lower magnetic members, the plurality of lower magnetic members being spaced apart from each other;

forming a first non-conductive structure to touch and lie over the plurality of lower magnetic members;

forming a coil to touch the first non-conductive structure and lie directly over the plurality of lower magnetic members;

forming a second non-conductive structure to touch and lie over the coil; and forming a plurality of upper magnetic members to touch the second non-conductive structure, the plurality of upper magnetic members lying directly over the coil and the plurality of lower magnetic members, and being spaced apart from each other and the plurality of lower magnetic members.

13. The method of claim 12 wherein each upper magnetic member lies horizontally adjacent to and spaced apart from the coil.

14. The method of claim 12 wherein the plurality of lower magnetic members and the plurality of upper magnetic members lie around a periphery of a die.

15. The method of claim 12 wherein forming the plurality of lower magnetic members includes:

forming a lower mold, the lower mold being non-conductive and having a top surface; and electroplating a magnetic material to touch the lower mold.

16. The method of claim 15 wherein forming the plurality of lower magnetic members further includes planarizing the magnetic material so that a top surface of each lower magnetic member and the top surface of the lower mold lie substantially in a single horizontal plane.

17. The method of claim 12 wherein forming the plurality of upper magnetic members includes:

forming an upper mold to touch the non-conductive member, the upper mold being non-conductive and having a top surface; and electroplating a magnetic material to touch the upper mold.

18. The method of claim 17 wherein forming the plurality of upper magnetic members further includes planarizing the magnetic material so that a top surface of each upper magnetic member and the top surface of the upper mold lie substantially in a single horizontal plane.

19. The method of claim 12 wherein the lower magnetic members include permalloy.

* * * * *